United States Patent
Rynne, Jr. et al.

(10) Patent No.: US 6,215,733 B1
(45) Date of Patent: Apr. 10, 2001

(54) DIGITAL DRIVE SONAR POWER AMPLIFIER

(75) Inventors: Edward F. Rynne, Jr., San Diego; Russell E. Hammond, La Jolla, both of CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/111,373

(22) Filed: Jun. 30, 1998

(51) Int. Cl.[7] ............................. H04B 1/02; H03B 7/14
(52) U.S. Cl. ................................................ 367/137
(58) Field of Search ............................ 367/137, 155; 363/43

(56) References Cited

U.S. PATENT DOCUMENTS

| | | | |
|---|---|---|---|
| 3,581,212 | * 5/1971 | McMurray | 363/43 |
| 4,360,707 | * 11/1982 | Joseph et al. | |
| 4,405,874 | * 9/1983 | Suthers | |
| 5,051,799 | * 9/1991 | Paul et al. | |
| 5,056,067 | * 10/1991 | Drumheller | |
| 5,469,403 | * 11/1995 | Young et al. | |

* cited by examiner

Primary Examiner—Daniel T. Pihulic
(74) Attorney, Agent, or Firm—Harvey Fendelman; Michael A. Kagan; Peter A. Lipovsky

(57) ABSTRACT

The invention integrates an amplifier directly into an electromechanical transducer assembly. In one embodiment of this invention, power from a power supply is supplied to what can be described as an electromechanical amplifier that includes bridge circuits that directly drive the transducer elements. Each transducer element can include its own co-located switching network, such as, for example, a bridge circuit, that can be used with other system components to control when and for how long a voltage of equal magnitude and of either a positive or negative polarity is selectively directed to the element to expand or contract it in relation to a signal desired to be acoustically transmitted. Besides permitting an output of two voltages of equal magnitude and opposite polarity, the bridge circuit also permits an output that is "open" and one that allows a dissipation of transducer element charge.

26 Claims, 9 Drawing Sheets

DRIVE STATES

| STATE | A | C | B | D |
|---|---|---|---|---|
| NOT ALLOWED | 1 | X | X | 1 |
| NOT ALLOWED | X | 1 | 1 | X |
| REVERSE DRIVE | 1 | 0 | 1 | 0 |
| FORWARD DRIVE | 0 | 1 | 0 | 1 |
| TOP SHORT | 1 | 1 | 0 | 0 |
| BOTTOM SHORT | 0 | 0 | 1 | 1 |

1 = SWITCH IS SHORTED
0 = SWITCH IS OPEN
X = DON'T CARE

FIG. 4

| FIG. 6A | FIG. 6B |

| AMPLITUDE "Y" | PHASE ANGLE DESIRED | CLOCK PULSE | PHASE ANGLE ACTUAL | DRIVE STATE |
|---|---|---|---|---|
| 0.5 | 1.91° | 3 | 2.10° | 1 ON |
| 2 | 7.66° | 11 | 7.75° | 2, 3 ON |
| 4 | 15.5° | 22 | 15.5° | 4, 5 ON |
| 6 | 23.6° | 34 | 23.9° | 6, 7 ON |
| 8 | 32.2° | 46 | 32.3° | 8, 9 ON |
| 10 | 41.8° | 59 | 41.5° | 10, 11 ON |
| 12 | 53.1° | 76 | 53.4° | 12, 13 ON |
| 14 | 69.0° | 98 | 68.9° | 14, 15 ON |
| 14 | 111° | 158 | 111° | 1, 2 OFF |
| 12 | 127° | 180 | 127° | 3, 4 OFF |
| 10 | 138° | 197 | 138° | 5, 6 OFF |
| 8 | 148° | 210 | 148° | 7, 8 OFF |
| 6 | 156° | 222 | 156° | 9, 10 OFF |
| 4 | 165° | 234 | 165° | 11, 12 OFF |
| 2 | 172° | 245 | 172° | 13, 14 OFF |
| 0.5 | 178° | 253 | 178° | 15 OFF |

FIG. 8

DIGITAL DRIVE SONAR POWER AMPLIFIER

BACKGROUND OF THE INVENTION

The invention relates generally to a method and apparatus for projecting acoustic signals. More specifically, the invention relates to a transducer system in which electromechanical transducer elements may be driven individually with either a positive or negative voltage of substantially the same magnitude.

Typically, transducer drive electronics include a power supply feeding an amplifier. The amplifier provides gain for an input signal, with the amplified input signal then being fed to a transducer assembly that includes several electromechanical transducer elements. These elements are electrically connected in parallel but operate mechanically in series, so that the mechanical displacements of the transducer elements are summed. In such as approach, all electromechanical transducer elements expand and contract in unison.

Referring to FIG. 1, a prior art acoustic transducer drive system 10 is shown. System 10 includes a very large, ship-based amplifier section 12 that includes of a number of bridge circuits 14 which gate power from power supply 16 to a transformer 18 primary winding "p". By appropriately controlling bridge circuit switches 20A–20D, properly phased, square-wave pulses are introduced into the secondaries "s" of transformers 18. These transformer outputs are then series summed to synthesize a desired waveform, such as a sinewave. The sythesized waveform is typically further amplified, such as by transformer 22 and is then typically tuned via a large, low frequency, tuning inductor 24. Finally, the waveform is conducted down an underwater drive cable and is presented electrically in parallel to a plurality of electromechanical transducer elements 26. The electromechanical elements convert the electrically synthesized signal to mechanical and acoustic power. The transducer elements are marked in this figure so that arrows go from negative to positive for the dipoles in these elements.

This approach to amplification can lead to amplifiers having efficiencies in excess of 80%. For some applications however, such as low frequency transmissions, miniaturization of the amplifiers is limited by the necessary size of the transformers, which can also be the heaviest component of the system. Miniaturization is also impeded by the necessary size of the low frequency, tuning inductors.

It is also known that a large, circulating reactive load is frequently encountered in the drive cable of such systems between the power amplifiers on a ship and the array of transducer elements below. Such reactive loads compel the use of large and heavy drive cables. Further, cross talk is frequently experienced between the alternating current transducer power signals and other signals in the transducer drive cable.

In the area of electromechanical materials, it is known that some of these materials exhibit a nonlinear expansion/contraction response, so that the materials require a direct current to bias the materials to a substantially flat section of their response. Besides these materials, a new generation of electromechanical materials are being researched. These materials do not require polarization, which has its advantages, however the expansion/contraction response of the materials can be highly non-linear.

SUMMARY OF THE INVENTION

The invention integrates an amplifier directly into an electromechanical transducer assembly. In one embodiment of this invention, power from a power supply is supplied to what can be described as an electromechanical amplifier that includes bridge circuits that directly drive the transducer elements. Each transducer element can include its own co-located switching network such as, for example, a bridge circuit, that can be used with other system components to control when and for how long a voltage of equal magnitude and of either a positive or negative polarity is selectively directed to the element to expand or contract it in relation to a signal desired to be acoustically transmitted. Besides permitting an output of two voltages of equal magnitude and opposite polarity, the bridge circuit also permits an output that is "open" and one that allows a dissipation of transducer element charge.

By directly driving transducer elements in the manner described, transformer and inductor requirements and their accompanying magnetics are minimized, furthering size reduction and weight reduction transducer design goals. Further, the co-location of transducer electronics with associated transducer drive elements restrains power (energy) circulation amongst these transducer system components, permitting downsizing of transducer drive cables and minimizing undesired cross-talk. By providing one of two drive voltages of equal magnitude and opposite polarity, transducer drive element biasing becomes unnecessary. This "digital" output also lends itself to be used with advanced transducer material technology, in which the non-linear response of these materials do not make them good candidates for being driven via alternating current.

OBJECTS OF THE INVENTION

An object of this invention is to provide a transducer system that minimizes transformer magnetics.

Another object of the invention is to provide a transducer system that minimizes the weight and size of amplification and inductor components.

Another object of the invention is to provide a transducer system that minimizes reactive currents in transducer drive cables.

Yet another object of the invention is to provide a transducer system that minimizes cross-talk in transducer signal lines.

Still another object of the invention is to provide a transducer system that minimizes the need to provide direct current biasing to transducer drive elements.

And still a further object of the invention is to provide a transducer system that is amenable to being used with electromechanical drive materials that have non-linear expansion/contraction response characteristics.

Other objects, advantages and new features of the invention will become apparent from the following detailed description of the invention when considered in conjunction with the accompanied drawings.

BRIEF DESCRIPTION OF THE DRAWINGS

FIG. 4 illustrates transducer element drive states according to one embodiment of the invention.

FIG. 8 illustrates examples of further characteristics of the drive elements for the embodiment of the invention illustrated in FIG. 6.

DESCRIPTION OF THE PREFERRED EMBODIMENT

Figure 1:
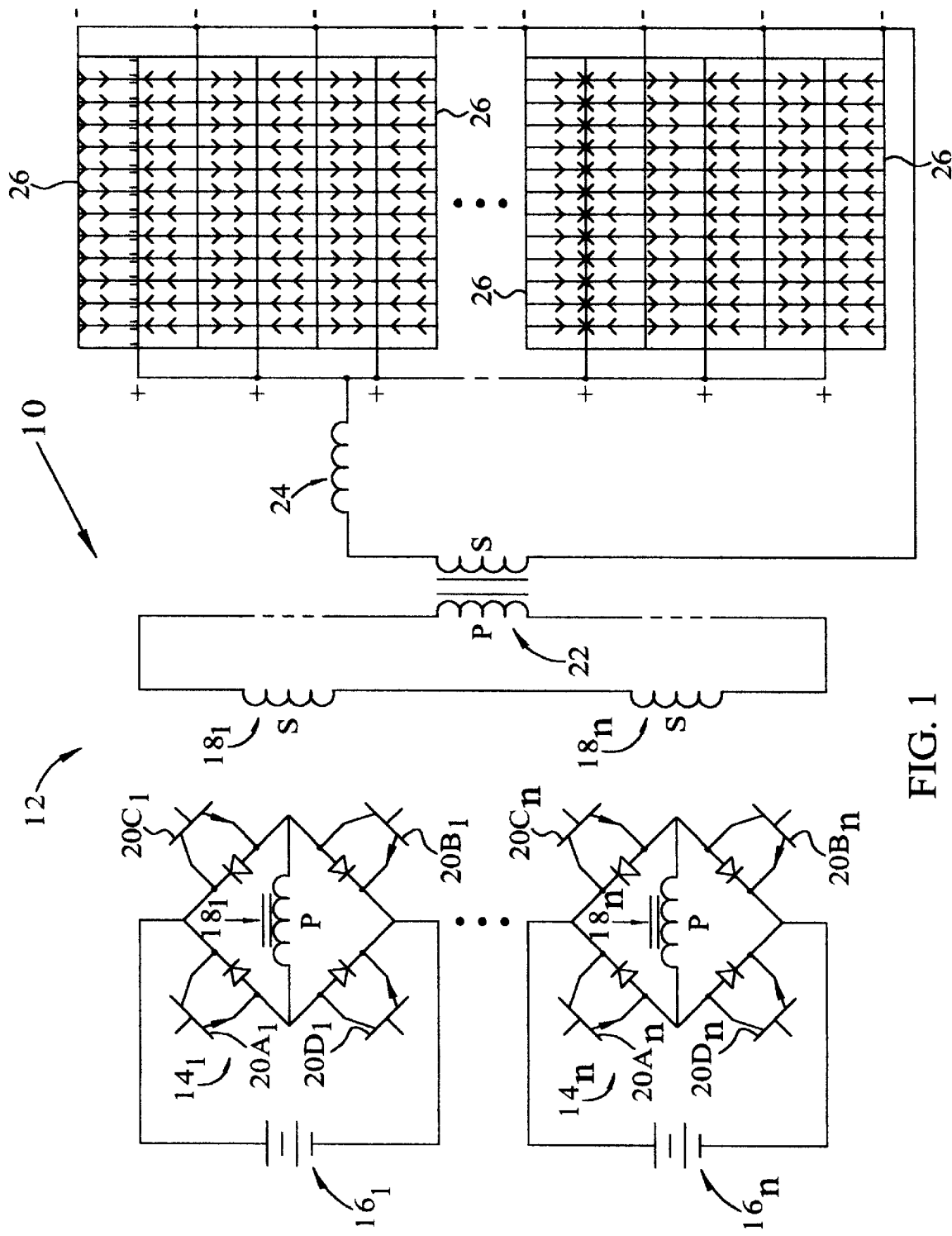
FIG. 1 illustrates components of an acoustic transmission system according to the prior art.

FIG. 1, as previously discussed, illustrates components of a typical acoustic transmission system as is present in the prior art.

Figure 2:
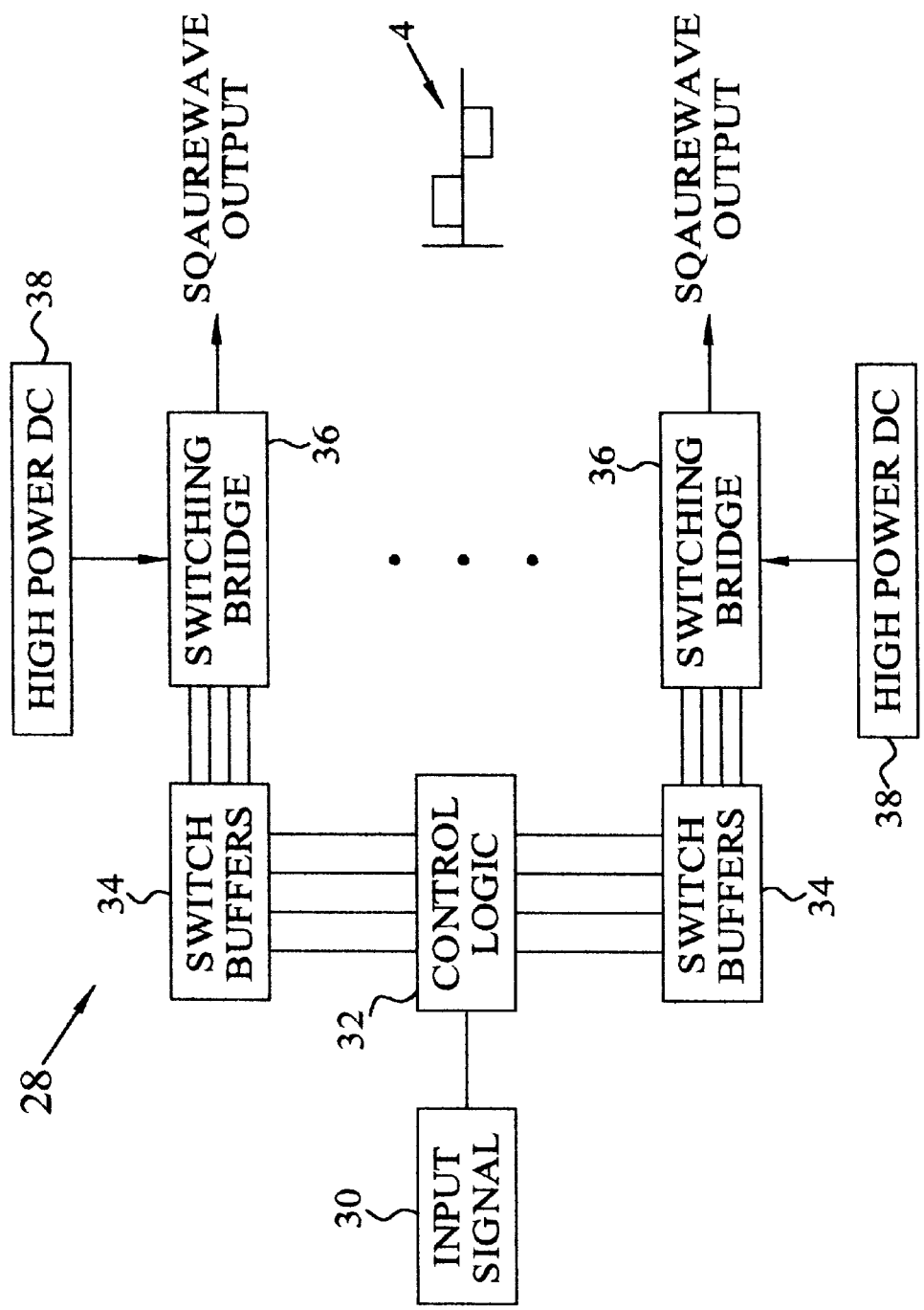
FIG. 2 illustrates control components for an acoustic transmission system.

Referring to FIG. 2, control components as may be utilized with the prior art acoustic transmission system described as well as with the invention are illustrated. Control components 28 include an input signal 30 that may, for example, take the form of either a varying voltage versus time (a replica of a signal desired to be acoustically transmitted), or may take the form of digital data. In the case of a replicated signal, a control logic element 32 identifies the amplitude and frequency characteristics of the signal and stores these for further processing. In the case of input signal 30 containing digital data, this data can be used to identify a signal previously stored within control 32 as well as the desired time when the signal is to be transmitted.

Referring again to FIG. 1, in either case, control logic 32 can take the form of an appropriate clock and counter that accesses read-only memories (ROM)s, one such ROM being dedicated to all of the "A" switches of bridges 14, one that is dedicated to all of the "B" switches of bridges 14, one for the "C" switches and one for the "D" switches. The ROMS are programmed according to the stored data to operate the timing and state of the switches so as to ultimately replicate a desired signal in the transducers elements to which they connect.

For the four-switch, bridge circuits shown in FIG. 1, control logic 32 will have an output for each of the switches within a bridge, these outputs will go to a switch buffer 34 individual to a bridge 14, in which the buffers will contain a combination of voltage and current that is suitable for actuating the switches.

The output of buffers 34 goes to switching bridges 36. An equivalent of these bridges is shown as switching bridges 14 of FIG. 1. Also input to switching bridges 36 will be transducer drive power 38, the equivalent of this being shown as power supply 16 in FIG. 1. The output of switching bridge 36 will essentially take the form of a square wave 40, which is typically periodic, and will be a function of the desired programming of the bridge switches.

Figure 3:
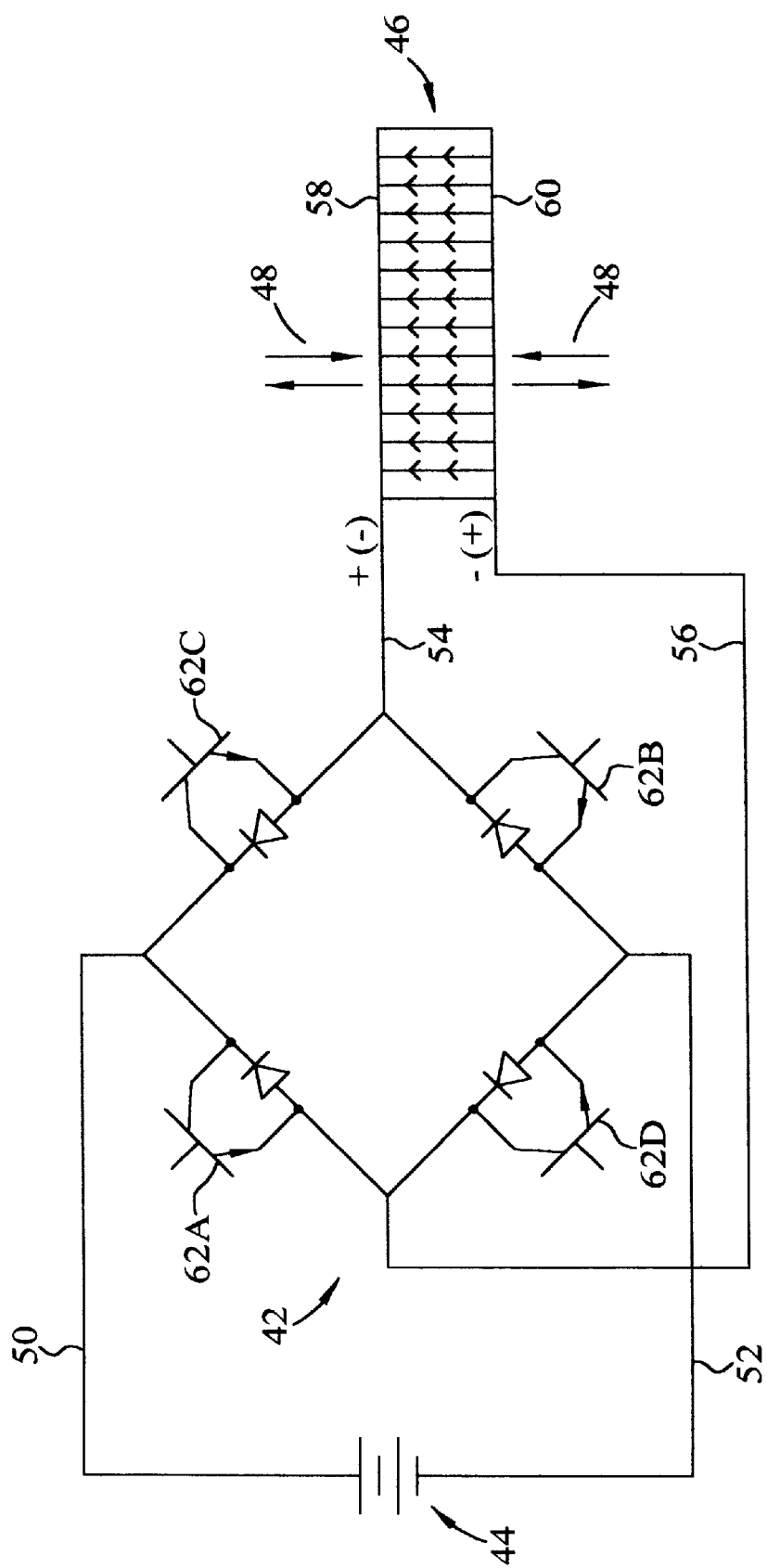
FIG. 3 illustrates acoustic transducer element drive components according to one embodiment of the invention.

Referring now to FIG. 3, an embodiment of the invention is illustrated in which a four switch switching bridge 42 is utilized to supply direct current power 44 directly to a substantially co-located transducer drive element 46. Element 46 has expansion and contraction characteristics that are substantially in direction 48 shown. Switching bridge 42 has two inputs 50 and 52 operably connected to supply 44, and has two outputs 54 and 56 that are operably connected respectively to one side 58 of element 46 that is substantially perpendicular to direction 48 and to a second side 60 that is opposite of side 58. Switches 62A–62D can be effectuated by the control components 28 illustrated in FIG. 2.

Referring to FIG. 4, the various drive states according to the programming of these switches are shown. Transducer drive element 46 of FIG. 3 is shown as having a dipole polarity going from negative to positive as depicted by the arrows on this element. According to this convention, a "forward drive" or expansion of the element takes place when switch "A" is open, switch "C" is shorted, switch "B" is open and switch "D" is shorted. A reverse drive occurs according to the switch states shown. In either case, one of two drive voltages of equal magnitude and opposite polarity can be presented to the transducer drive element. The four switch bridge circuit also permits either surface of element 46 to be shorted, allowing for any charge on these surfaces to be dissipated. Not shown is an all open switch condition.

One skilled in the art will realize that for the embodiments of the invention described here, a two switch, half-bridge, or other switching schemes and mechanisms could be utilized to accomplish the task of selectively providing a transducer element with a voltage of substantially the same magnitude but of opposite polarities. In similar regard, a variety of switch designs could be called upon to carry out this task, including, but not limited to, bipolar transistors, field effect transistors, and gate turn-off silicon-controlled rectifiers. Suitable transducer materials for such embodiments, include, but are not limited to, piezoelectric and electrostrictive as well as a variety of the "advanced" ceramic materials, such as, lead magnesium niobate—lead titanate (PMN-PT), and tin-modified lead lanthanum zirconate titanate (PLZTS). Also, though a direct current source of power has been discussed as utilized, one of ordinary skill in the art will realize that alternating current appropriately rectified and filtered is also possible.

Figure 5:
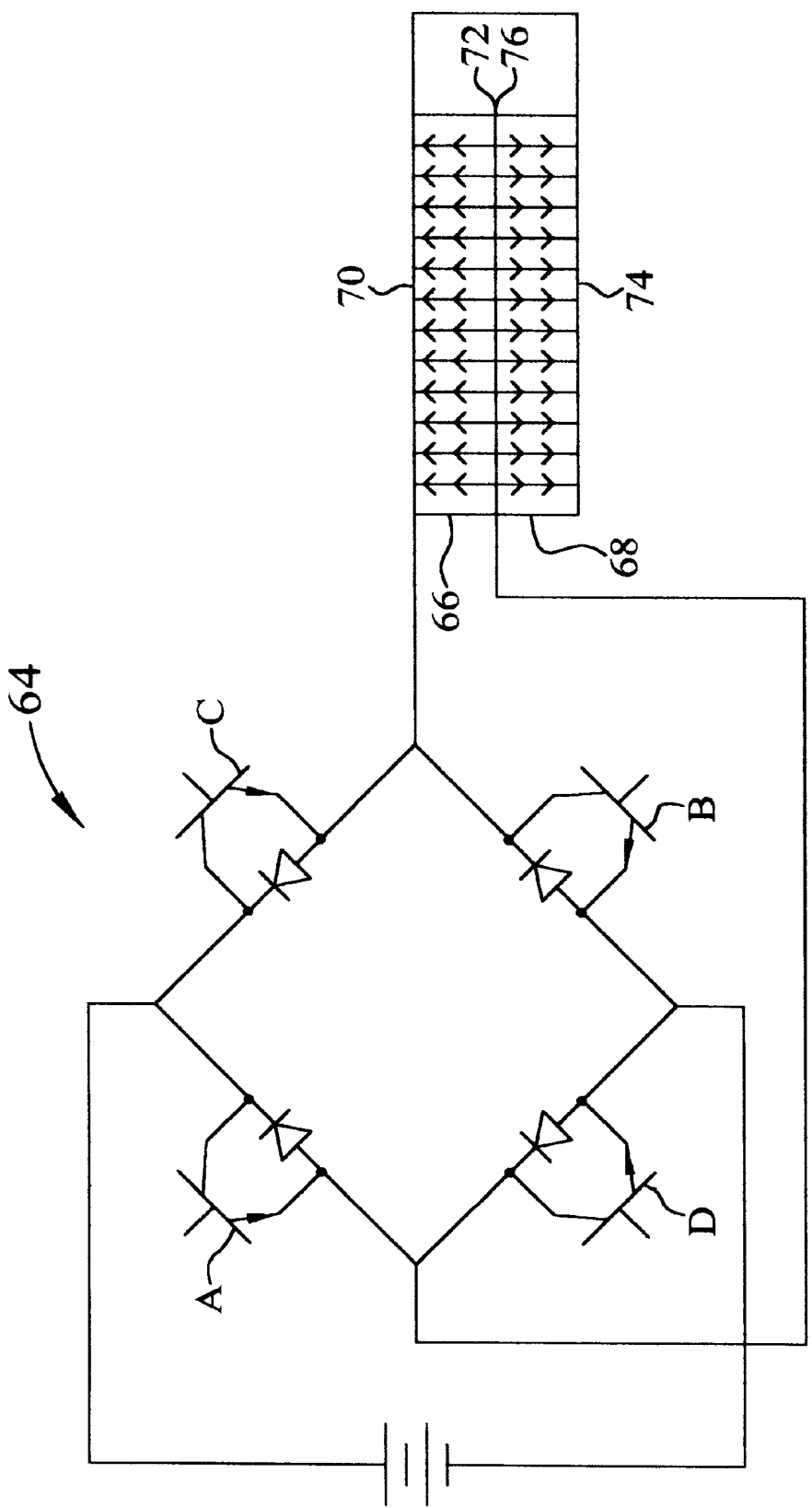
FIG. 5 illustrates acoustic transducer element drive components according to another embodiment of the invention.

Referring now to FIG. 5, another embodiment of the invention is shown in which a pair of transducer elements are coupled together so that the expansion/contraction effects of these elements are constructively added through the use of a single switching circuit 64. As can be seen, transducer elements 66 and 68 are disposed in opposite polarizing directions. Element 66 has a side 70 of one polarization and a second, opposite, side 72 of a second polarization. Similarly, element 68 has a side 74 of one polarization and a second, opposite, side 76 of a second polarization in which the elements are arranged so that a like polarizations of each element are shared electrically.

Figures 6, 6A:
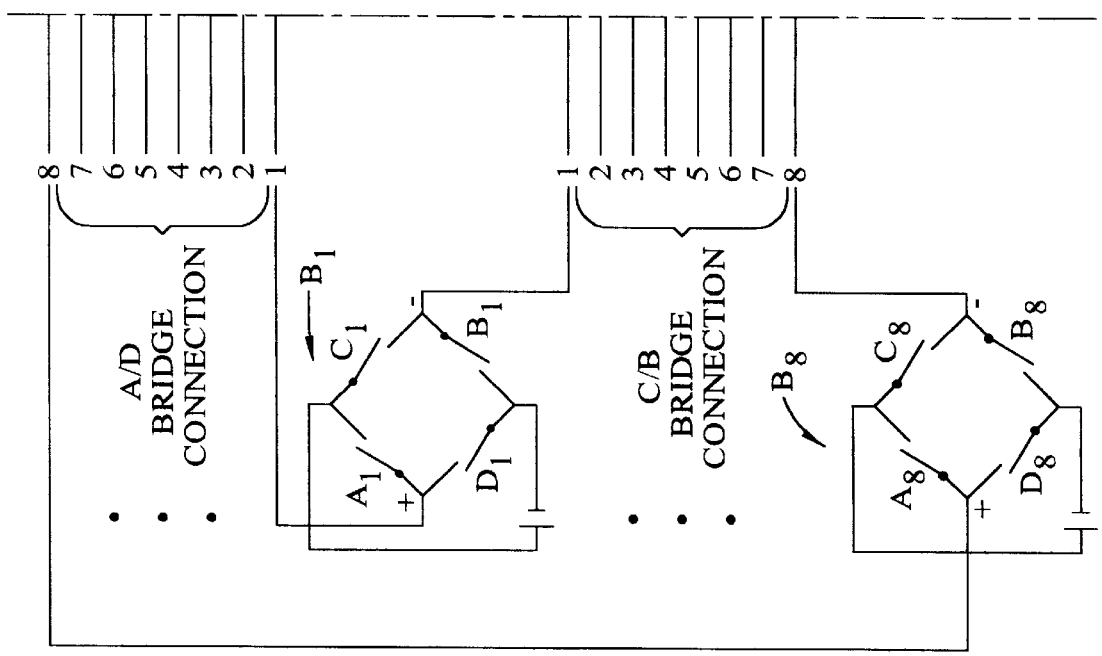
FIG. 6 illustrates acoustic transducer element drive components according to yet another embodiment of the invention.
Figure 6B:
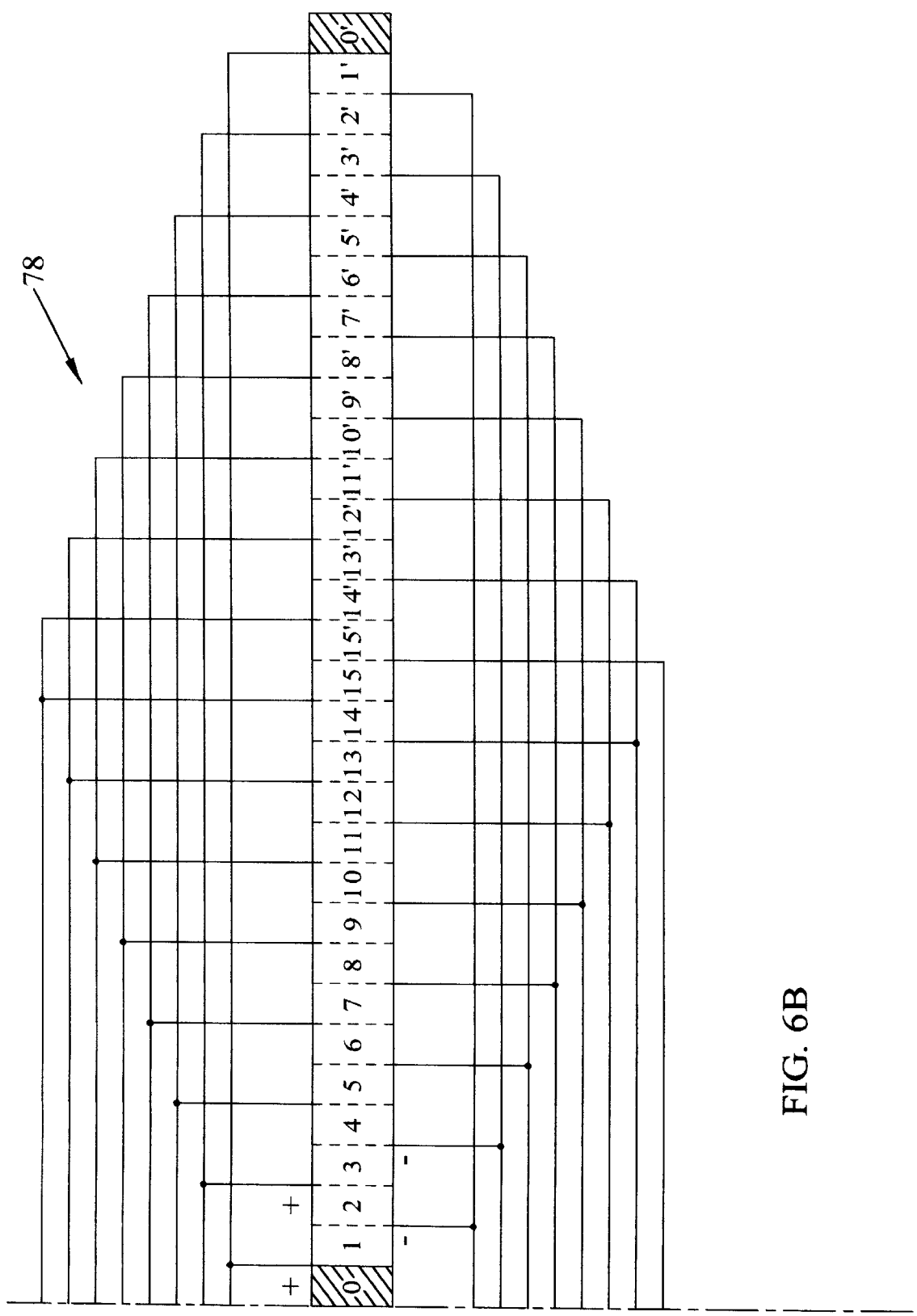

Referring now to FIG. 6, another embodiment of the invention is shown. In FIG. 6, a plurality of transducer drive elements 78 are shown as may be assembled into a transducer housing. End pieces 0 and 0' are not drive elements, but serve as insulating isolators. Adjacent drive elements 78 are arranged in opposing poling directions, as illustrated by the pair of drive elements of FIG. 5. Eight bridges B1–B8, according to the invention, are utilized and are operably connected symmetrically to the elements so that bridge B1 is operably connected to the sides of transducer elements 1 and 1', bridge B2 is operably connected to the sides of transducer elements 3 and 3' and so on and so forth ending with bridge B8 being operably connected to the opposite poled sides of elements 15 and 15'. In this configuration, the even numbered elements are driven appropriately based upon the output of the two bridges connected thereto.

Figure 7:
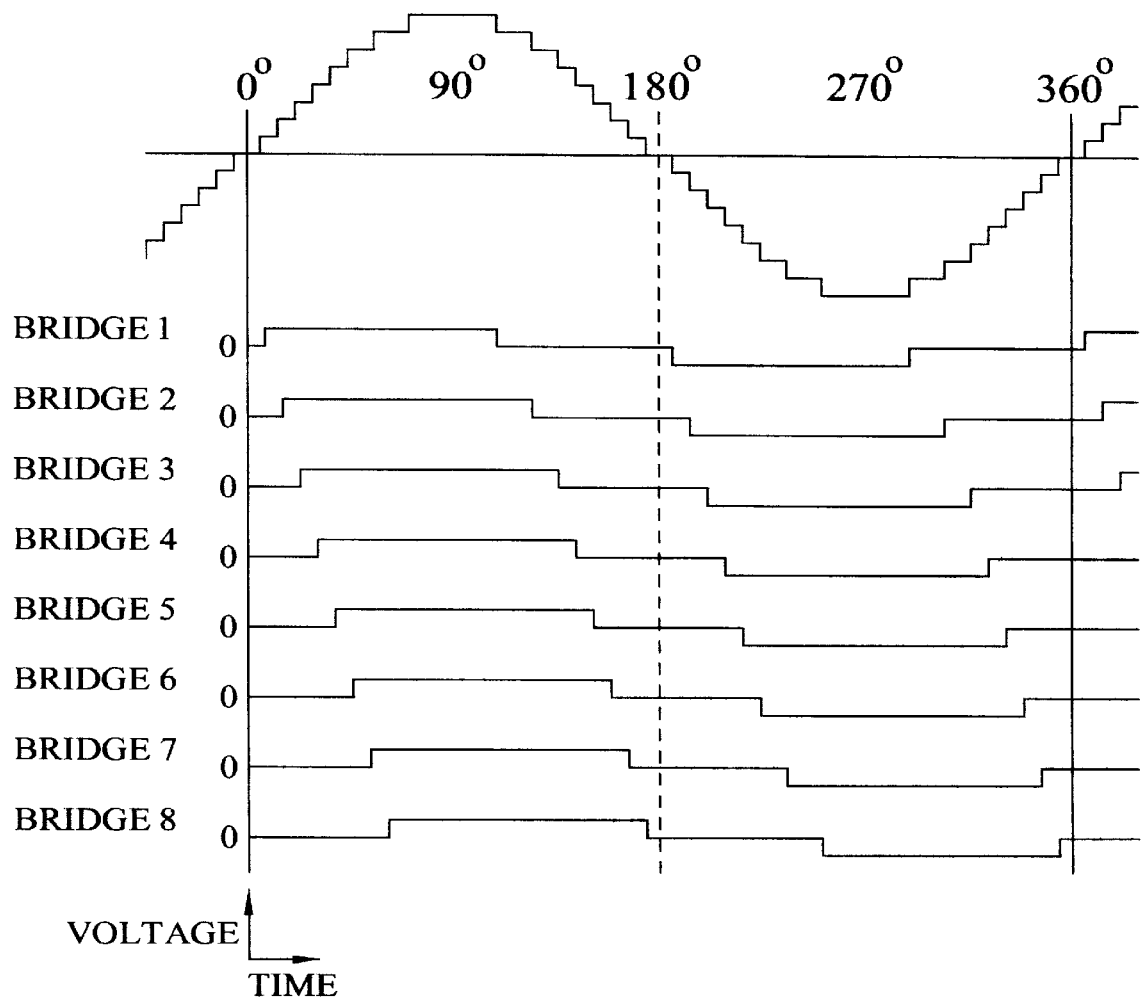
FIG. 7 illustrates in a top portion thereof an example of the combined mechanical displacements of the individual drive elements shown in FIG. 6, and in a bottom portion thereof illustrates examples of bridge electrical output as well as the corresponding mechanical displacement of individual drive elements of FIG. 6.

Referring now to FIGS. 7 and 8, an approach by which the transducer drive elements of FIG. 6 provide a sinusoidal output is shown. As can be seen in these figures, for a 256 clock pulse, periodic wave, bridge 1 (B1) is first switched "on" at clock pulse 3 at an actual phase angle of 2.10 degrees. FIG. 8 shows bridge 1 going to a positive "high" voltage level from a 0 voltage level. As can be seen in FIG.

8, transducer drive 1 (as well as 1') go into a forward drive state (in this case, an expansion mode). Next, bridge 2 is programmed to go "high" at clock pulse 11, resulting in a forward drive state for elements 3 and 3'. For the time that both bridge 1 and bridge 2 are producing a high voltage output, transducer drives 2 and 2' are appropriately driven. In this case, drives 1, 2 and 3 (as well as 1', 2' and 3') are all in an expansion mode. FIG. 8 shows the drive states for transducer drive elements 60 for the first 180 degrees of phase of a desired acoustic signal. However, as can be seen from FIG. 7, the same switching sequence is provided for the latter 180 degrees of phase except the transducer drive elements are driven in reverse. This can most easily be seen by examining FIG. 7 in which it is apparent that bridge 1 output goes to a "low" voltage level from zero voltage at 2.10 degrees into the second 180 degrees of phase.

The top of FIG. 7 illustrates the synthesized sinusoidal output of a transducer assembly as illustrated in FIG. 6, when programmed according to the instructions given.

An analogous application of the invention would be to employ multiple "voice coils" in a moving coil transducer where instead of summing the magnetic field in the transducer, the forces generated by the individual coils could be summed to drive the transducer radiator. In an analogous fashion to electrostrictive materials, individual magnetic coils could excite magnetostrictive elements which could then be summed mechanically to achieve a desired signal. Thus, the basic approach of the invention may be extended to both magnetic and magnetostrictive approaches as well.

Obviously, many modifications and variations of the invention are possible in light of the above teachings. It is therefore to be understood that within the scope of the appended claims the invention may be practiced otherwise than as has been specifically described.

What is claimed is:

1. A transducer apparatus comprising:
   an electromechanical transducer drive element having an expansion and contraction direction and having one side that is substantially perpendicular to said expansion and contraction direction and having a second side that is substantially opposite said first side,
   a voltage supply; and
   a switching system individual to said electromechanical transducer drive element and operably coupled thereto and to said voltage supply for selectively providing a voltage of equal magnitude and opposite polarity to each of said first and second sides of said electromechanical transducer drive element.

2. An apparatus according to claim 1 in which said switching system also provides an output voltage of 0 volts.

3. An apparatus according to claim 2 in which said voltage supply is a direct current voltage supply.

4. An apparatus according to claim 2 in which said electromechanical transducer element includes a piezoelectric material.

5. An apparatus according to claim 1 in which said electromechanical transducer drive element and said switching system are substantially co-located.

6. An apparatus according to claim 1 in which said apparatus is one of a plurality in a transducer assembly.

7. An apparatus according to claim 1 in which said switching system includes a four switch switching bridge that includes two input terminals operably coupled to said voltage supply and a first output terminal operably coupled to said first side of said electromechanical transducer drive element and a second output terminal operably coupled to said second side of said electromechanical transducer drive element.

8. An apparatus according to claim 7 in which said switching bridge also provides an output voltage of 0 volts.

9. An apparatus according to claim 8 in which said electromechanical transducer drive element and said switching bridge are substantially co-located.

10. An apparatus according to claim 9 in which said voltage supply is a direct current voltage supply.

11. A transducer apparatus comprising:
    an electromechanical transducer drive element having one side of one polarization and a second, opposite, side of a second polarization;
    a voltage supply; and
    a switching system individual to said electromechanical transducer drive element and operably coupled thereto and to said voltage supply for selectively providing a voltage of equal magnitude and opposite polarity to each of said first and second sides of said electromechanical transducer drive element.

12. An apparatus according to claim 11 in which said switching system also provides an output voltage of 0 volts.

13. An apparatus according to claim 12 in which said voltage supply is a direct current voltage supply.

14. An apparatus according to claim 12 in which said electromechanical transducer element includes a piezoelectric material.

15. An apparatus according to claim 11 in which said electromechanical transducer drive element and said switching system are substantially co-located.

16. An apparatus according to claim 11 in which said apparatus is one of a plurality in a transducer assembly.

17. An apparatus according to claim 11 in which said switching system includes a four switch switching bridge that includes two input terminals operably coupled to said voltage supply and a first output terminal operably coupled to said first side of said electromechanical transducer drive element and a second output terminal operably coupled to said second side of said electromechanical transducer drive element.

18. An apparatus according to claim 17 in which said switching bridge also provides an output voltage of 0 volts.

19. An apparatus according to claim 18 in which said electromechanical transducer drive element and said switching bridge are substantially co-located.

20. An apparatus according to claim 19 in which said voltage supply is a direct current voltage supply.

21. A method for driving an electromechanical transducer comprising the steps of:
    providing an electromechanical transducer drive element, said drive element having an expansion and contraction direction and having one side that is substantially perpendicular to said expansion and contraction direction and having a second side that is substantially opposite said first side;
    providing a voltage source; and
    electrically connecting said voltage source individually to said electromechanical transducer to provide one of two voltages of equal magnitude and opposite polarity to said first and second sides of said electromechanical transducer drive element, so that said transducer element dimensionally changes in response to said voltage.

22. A method for providing an acoustical signal from an electrical signal according to claim 21 wherein said method is utilized to provide for the expansion and contraction of a plurality of said transducer elements to generate a desired acoustic signal.

23. A method for driving an electromechanical transducer comprising the steps of:
  providing an electromechanical transducer drive element, said drive element having one side of one polarization and a second, opposite, side of a second polarization;
  providing a voltage source; and
  electrically connecting said voltage source individually to said electromechanical transducer to provide one of two voltages of equal magnitude and opposite polarity to said first and second sides of said electromechanical transducer drive element, so that said transducer element dimensionally changes in response to said voltage.

24. A method for providing an acoustical signal from an electrical signal according to claim 23 wherein said method is utilized to provide for the expansion and contraction of a plurality of said transducer elements to generate a desired acoustic signal.

25. An apparatus according to claim 1 in which said switching system is utilized in providing voltage to no more than two electromechanical transducer drive elements.

26. An apparatus according to claim 11 in which said switching system is utilized in providing voltage to no more than two electromechanical transducer drive elements.

* * * * *